(12) United States Patent  (10) Patent No.: US 9,397,178 B2
Liang et al.  (45) Date of Patent: Jul. 19, 2016

(54) SPLIT GATE POWER SEMICONDUCTOR FIELD EFFECT TRANSISTOR

(71) Applicants: Jiajin Liang, Hong Kong (CN); Chun Wai Ng, Hong Kong (CN); Johnny Kin On Sin, Hong Kong (CN)

(72) Inventors: Jiajin Liang, Hong Kong (CN); Chun Wai Ng, Hong Kong (CN); Johnny Kin On Sin, Hong Kong (CN)

(73) Assignee: Jiajin Liang, Hong Kong (CN)

( * ) Notice: Subject to any disclaimer, the term of this patent is extended or adjusted under 35 U.S.C. 154(b) by 0 days.

(21) Appl. No.: 14/766,594

(22) PCT Filed: Dec. 4, 2014

(86) PCT No.: PCT/CN2014/093007
§ 371 (c)(1),
(2) Date: Aug. 7, 2015

(87) PCT Pub. No.: WO2015/096605
PCT Pub. Date: Jul. 2, 2015

(65) Prior Publication Data
US 2015/0372103 A1 Dec. 24, 2015

(30) Foreign Application Priority Data

Dec. 23, 2013 (HK) .................................. 131141888

(51) Int. Cl.
*H01L 29/423* (2006.01)
*H01L 29/40* (2006.01)
*H01L 29/66* (2006.01)
*H01L 29/739* (2006.01)
*H01L 29/78* (2006.01)

(52) U.S. Cl.
CPC .......... *H01L 29/4238* (2013.01); *H01L 29/402* (2013.01); *H01L 29/405* (2013.01);
(Continued)

(58) Field of Classification Search
CPC .............. H01L 29/4238; H01L 29/402; H01L 29/66712; H01L 29/7802; H01L 29/405; H01L 29/4232; H01L 29/66333; H01L 29/7395; H01L 29/1095; H01L 29/66325; H01L 27/11273; H01L 27/2454
USPC ........... 257/47, 205, 288, 341, 368, 367, 369, 257/526, 565, 575; 438/131, 138, 140, 151, 438/156, 170, 197, 192, 199, 336
See application file for complete search history.

(56) References Cited

U.S. PATENT DOCUMENTS 5,644,150 A * 7/1997 Iwamuro ............... H01L 29/102
257/147
6,025,229 A 2/2000 Hong
(Continued)

FOREIGN PATENT DOCUMENTS

CN 101051652 5/2011

OTHER PUBLICATIONS

International Search Report and Written Opinion for International Application No. PCT/CN2014/093007, Dated Mar. 6, 2015, 9 pgs., (English Translation Included).

*Primary Examiner* — Jarrett Stark
*Assistant Examiner* — Shahed Ahmed
(74) *Attorney, Agent, or Firm* — Hamre, Schumann, Mueller & Larson, P.C.

(57) ABSTRACT

The present invention generally relates to a structure and manufacturing of a power field effect transistor (FET). The present invention provides a planar power metal oxide semiconductor field effect transistor (MOSFET) structure and an insulated gate bipolar transistor (IGBT) structure comprising a split gate and a semi-insulating field plate. The present invention also provides manufacturing methods of the structures.

7 Claims, 11 Drawing Sheets

(52) U.S. Cl.
CPC ...... *H01L29/4232* (2013.01); *H01L 29/66333* (2013.01); *H01L 29/66712* (2013.01); *H01L 29/7395* (2013.01); *H01L 29/7802* (2013.01)

(56) References Cited

U.S. PATENT DOCUMENTS

| | | | | |
|---|---|---|---|---|
| 2004/0009638 A1* | 1/2004 | Tanaka | ................ | H01L 23/4824 438/202 |
| 2006/0249785 A1* | 11/2006 | Bhalla | .................... | H01L 29/402 257/328 |
| 2007/0278571 A1* | 12/2007 | Bhalla | ................ | H01L 29/0847 257/341 |
| 2013/0049010 A1* | 2/2013 | Roberts | ............. | H01L 29/41725 257/76 |
| 2015/0325691 A1* | 11/2015 | Miyakoshi | ........ | H01L 29/42372 257/329 |

* cited by examiner 14
15
FIG. 6A
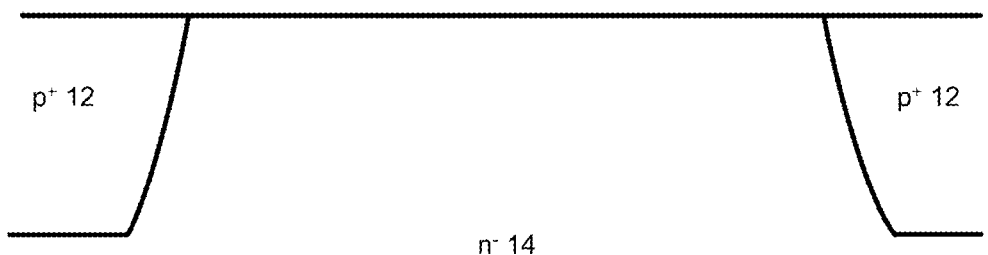
FIG. 6B
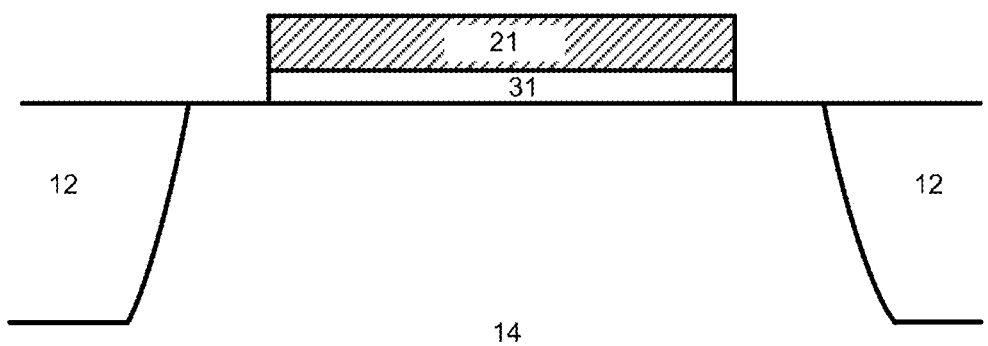
FIG. 6C n- 14

SPLIT GATE POWER SEMICONDUCTOR FIELD EFFECT TRANSISTOR

BACKGROUND

1. Technical Field

The present invention generally relates to a structure and manufacturing of a power semiconductor device, and more particularly relates to a split gate planar power semiconductor field effect transistor (FET).

2. Related Art

The present invention will be illustrated in an n channel power FET, but it will be understood in the following description that the present invention is similarly applicable to a p channel power FET. In the specification of the present invention, heavily doped n-type regions are labeled as n+, and heavily doped p-type regions are labeled as p+. These heavily doped regions generally have a doping concentration between $1 \times 10^{18}$ cm$^{-3}$ and $1 \times 10^{21}$ cm$^{-3}$. In the specification of the present invention, lightly doped n-type regions are labeled as n−, and lightly doped p-type regions are labeled as p−. These lightly doped regions generally have a doping concentration between $1 \times 10^{13}$ cm$^{-3}$ and $1 \times 10^{17}$ cm$^{-3}$.

The power MOSFET has been widely used in switching applications. A high switching speed is needed to reduce the switching power loss and the sizes of passive components in a system. Thus, the object of the present invention is to provide a split gate power MOSFET with high switching speed.

In addition, the high switching speed is also needed in an IGBT structure. Therefore, another object of the present invention is to provide a split gate IGBT with high switching speed.

PRIOR ART

FIG. 1 shows a cross section of a power MOSFET structure in the prior art. As shown in the figure, in the off state, the high voltage can be blocked between the drain and the source of the device by the reverse biased p− type body region (13)/n−-epitaxy (14) juncture. In the on state, the current can be conducted between the n+ source (11) and the n−-epitaxy (14) via an n-type channel. In the switching period of the device, the n−-epitaxy (14) below the gate (21) is charged or discharged by the gate capacitance. Therefore, the switching speed of the device mostly depends on the gate (21)-n−-epitaxy (14) overlapping region. The overlapping region can be reduced by reducing the distance between the two adjacent p− type body regions (13) to improve the switching speed. However, if the two adjacent p− type body regions (13) are too close to each other, high resistance in the upper part of the n−-epitaxy (14) located between the two adjacent p− type body regions (13) will thus be caused, and undesirable high on-resistance of the device can be caused.

FIG. 2 shows another power MOSFET structure [1] in the prior art. As shown in the figure, the split gate structure of the device can produce a much smaller gate (21)-n−-epitaxy (14) overlapping region and therefore the device has a higher switching speed compared with the device previously shown in FIG. 1. Meanwhile, the space between the adjacent p-type body regions (13) is not reduced to maintain substantially identical on-resistance. However, in the off state, the split gate can result in a high electric field at the edge of the gate (21)-n−-epitaxy (14) overlapping region, and the high electric field can cause a pre-mature breakdown [2] of the device.

FIG. 3 shows yet another power MOSFET structure [2] in the prior art. The device has the same split gate structure as the device previously shown in FIG. 2. The device has an additional dummy gate (22) connected to the source electrode (22). The dummy gate (22) has the function of a field plate, which can reduce the electric field at the edge of the gate electrode (21) in the off state. Therefore, the problem of pre-mature breakdown is solved. However, an advanced photolithography step is required to form a small gap between the dummy gate (22) and the split gate (21). In addition, additional capacitance is produced at the side wall of the split gate (21) by the dummy gate (22), which may lead to the reduction of the switching speed compared with the switching speed of the device shown in FIG. 2.

SUMMARY

Therefore, an objective of the present invention is to provide a split gate planar power FET with high switching speed but without the problem of pre-mature breakdown.

In order to achieve the objective and other objectives, the present invention provides a planar power MOSFET structure comprising a split gate (21) and a semi-insulating field plate (34) as shown in FIG. 4. The semi-insulating field plate (34) is connected to a source electrode (22) at the side wall.

The RC delay time of the semi-insulating field plate (34) is greater than the typical switching time of the device by more than one order of magnitude due to high resistivity of the semi-insulating field plate (34). For example, the switching time of the power MOSFET in the current advanced technology is about $10^{-8}$ s, while the RC delay time of the plate (34) is generally about $10^{-5}$ s. Due to such difference, the semi-insulating field plate (34) can hardly conduct any transient current during switching, therefore, no switching delay will occur even if there is a big overlapping region between the semi-insulating field plate (34) and the gate (21). On the other hand, the potential of the semi-insulating field plate (34) remains the same as that of the source electrode (22) because there is no static current in the semi-insulating field plate (34) in an off state of the device. Therefore, similar to a dummy gate (22), the semi-insulating field plate can also suppress a high electric field near the gate electrode (21) and thus prevent pre-mature breakdown.

In order to realize this object and other objects, the present invention also provides an insulated gate bipolar transistor (IGBT) comprising a split gate (21) and a semi-insulating field plate (34) as shown in FIG. 5. Being similar in the power MOSFET, the split gate (21) can provide a high switching speed and the semi-insulating field plate (34) can prevent pre-mature breakdown.

A split gate planar power MOSFET structure, comprising
a drain electrode (23) at the bottom,
a heavily doped substrate (15) of a first conductivity type,
a lightly doped epitaxial layer (14) of the first conductivity type, the lightly doped epitaxial layer (14) being on the top of the heavily doped substrate (15),
a heavily doped diffusion (12) of a second conductivity type, the heavily doped diffusion (12) being contacted by a source electrode (22),
a body region (13) of the second conductivity type, the body (13) being connected to the source electrode (22) through the heavily doped diffusion (12),
a heavily doped source (11) of the first conductivity type, the heavily doped source (11) being contacted by the source electrode (22),
a gate dielectric (31), covering the surface of the body region (13) and forming a channel between the heavily doped source (11) and the lightly doped epitaxial layer (14),
a split gate electrode (21), the split gate electrode (21) being on the top of the gate dielectric (31), a thin dielectric layer (33), covering the surfaces of the split gate (21) and the lightly doped epitaxial layer (14), a semi-insulating field plate (34), the semi-insulating field plate (34) being on the top of the thin dielectric layer (33) and contacted by the source electrode (22) at the side wall, an interlayer dielectric (ILD) (32), the interlayer dielectric (32) being on the top of the semi-insulating field plate (34), and the source electrode (22), the source electrode (22) being in contact holes (41) and on the top of the described ILD (32).

Further, the gate dielectric (31) is silicon oxide.

Further, the split gate electrode (21) is at least one of polysilicon, metal and metal silicide.

Further, the thin dielectric layer (33) is silicon oxide.

Further, the semi-insulating field plate (34) comprises titanium nitride, polysilicon and amorphous silicon.

Further, the ILD (32) is silicon oxide.

Further, both the drain electrode (23) and the source electrode (22) are metal or metal silicide.

A split gate planar IGBT structure comprises:

a collector electrode (23) at the bottom;

a heavily doped collector region (17) of a second conductivity type;

a buffer region (16) of a first conductivity type, the buffer region (16) being on the top of the collector region (17);

a lightly doped drift region (14) of the first conductivity type, the lightly doped drift region (14) being on the top of the buffer region (16);

a heavily doped diffusion (12) of the second conductivity type, the heavily doped diffusion (12) being contacted by an emitter electrode (24);

a body region (13) of the second conductivity type, the body region (13) being connected to the emitter electrode (24) through the heavily doped diffusion (12);

a heavily doped emitter region (11) of the first conductivity type, the heavily doped emitter region (11) being contacted by the emitter electrode (24);

a gate dielectric (31), covering the surface of the body region (13) and forming a channel between the heavily doped emitter region (11) and the lightly doped drift region (14);

a split gate electrode (21), the split gate electrode (21) being on the top of the gate dielectric (31);

a thin dielectric layer (33), covering the surfaces of the split gate electrode (21) and the lightly doped epitaxial layer (14);

a semi-insulating field plate (34), the semi-insulating field plate (34) being on the top of the thin dielectric layer (33) and contacted by the emitter electrode (24) at the side wall;

an interlayer dielectric (ILD) (32), the interlayer dielectric being on the top of the semi-insulating field plate (34); and the emitter electrode (24), the emitter electrode (24) being in contact holes (41) and on the top of the ILD (32).

Further, both the collector electrode (25) and the emitter electrode (24) are metal or metal silicide.

Further, the gate dielectric (31) is silicon oxide.

Further, the split gate electrode (21) is at least one of polysilicon, metal and metal silicide.

Further, the thin dielectric layer (33) is silicon oxide.

Further, the semi-insulating field plate (34) comprises titanium nitride, polysilicon and amorphous silicon.

Further, the ILD (32) is silicon oxide.

A method for manufacturing a split gate planar power MOSFET structure comprises (1) forming a lightly doped epitaxial layer (14) of a first conductivity type on the top of a heavily doped substrate (15) of the first conductivity type by epitaxial growth, (2) forming a heavily doped diffusion (12) of a second conductivity type by ion implantation and thermal diffusion, (3) forming a gate dielectric (31), forming a gate electrode (21) by deposition, and patterning the gate dielectric (31) and the gate electrode (21), (4) forming a body region (13) of the second conductivity type by self-aligned ion implantation and thermal diffusion, (5) forming a split gate (21) by patterning the gate electrode (21) and the gate dielectric (31), (6) forming a heavily doped source electrode (11) of the first conductivity type by ion implantation and annealing, and depositing a thin dielectric layer (33), a semi-insulating field plate (34) and an ILD (32), (7) patterning the ILD (32), the semi-insulating field plate (34) and the thin dielectric layer (33) to form contact holes (41) and (8) forming a source electrode (22) at the bottom, the surface and the drain electrode (23).

Further, the split gate (21) is patterned by photolithography and etching.

Further, the ion implantation is optionally carried out after the split gate (21) is etched to improve the doping concentration of the upper part of the n⁻-epitaxy (14).

Further, the ILD (32), the semi-insulating field plate (34) and the thin dielectric layer (33) are patterned by photolithography and etching simultaneously.

A method for manufacturing a split gate planar IGBT structure comprises (1) starting with a lightly doped substrate wafer (14) of a first conductivity type, (2) forming a heavily doped diffusion (12) of a second conductivity type by ion implantation and thermal diffusion, (3) forming a gate dielectric (31), forming a gate electrode (21) by deposition, and patterning the gate dielectric (31) and the gate electrode (21), (4) forming a body region (13) of the second conductivity type by self-aligned ion implantation and thermal diffusion, (5) forming a split gate (21) by patterning the gate electrode (21) and the gate dielectric (31), (6) forming a heavily doped emitter region (11) of the first conductivity type by implantation and annealing, and depositing a thin dielectric layer (33), a semi-insulating field plate (34) and an ILD (32), (7) patterning the ILD (32), the semi-insulating field plate (34) and the thin dielectric layer (33) to form contact holes (41), and forming an emitter electrode (24) on the surface, and (8) thinning down the substrate wafer (14), forming a buffer layer (16) of the first conductivity type by ion implantation and annealing, forming a heavily-doped collector region (17) by ion implantation and annealing, and forming a collector (25) at the bottom.

Further, the split gate (21) is patterned by photolithography and etching.

Further, the ion implantation is optionally carried out after the split gate (21) is etched to improve the doping concentration of the upper part of the n⁻-epitaxy (14).

Further, the ILD (32), the semi-insulating field plate (34) and the thin dielectric layer (32) are patterned simultaneously through photolithography and etching.

BRIEF DESCRIPTION OF THE DRAWINGS

FIG. 6A-FIG. 6H show the critical process steps of the power MOSFET previously shown in FIG. 4.

FIG. 7A-FIG. 7H show the critical process steps of manufacturing the IGBT previously shown in FIG. 5.

DETAILED DESCRIPTION

Figure 1:
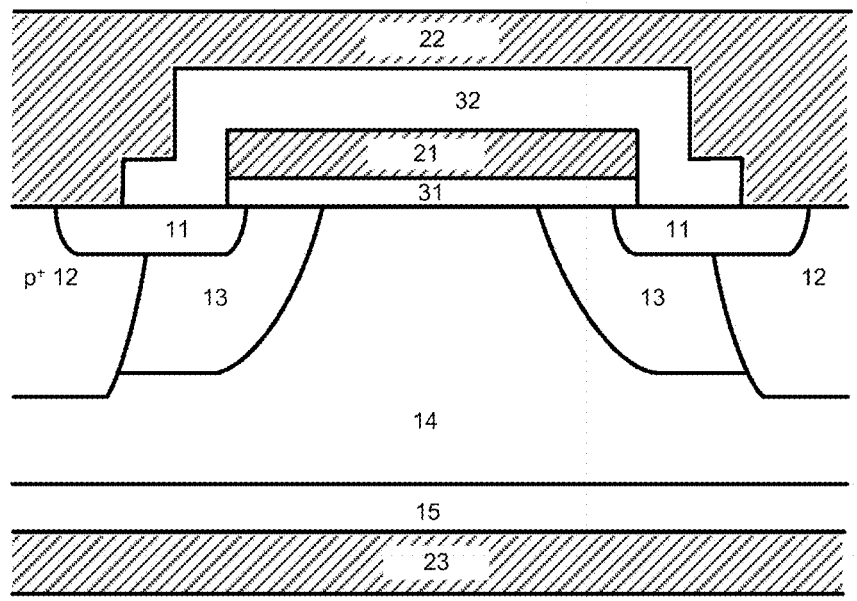
FIG. 1 is a cross sectional view of a power MOSFET structure in the prior art.

FIG. 1 is a cross sectional view of a power MOSFET structure in the prior art. A gate electrode (21) is on the top of a gate dielectric (31), and the gate dielectric (31) covers the entire surface of an n$^-$-epitaxy (14).

Figure 2:
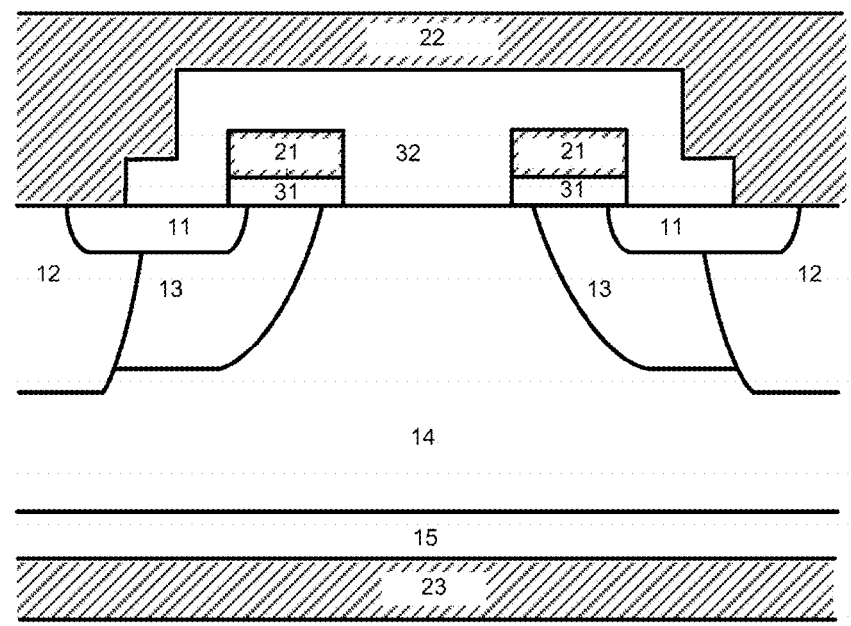
FIG. 2 is a cross sectional view of another power MOSFET structure in the prior art.

FIG. 2 is a cross sectional view of another power MOSFET structure in the prior art. The device has a split gate (21) and a gate dielectric (31) below the gate (21). Only a small portion of the surface of the n$^-$-epitaxy (14) is covered by the gate dielectric (31), and the remaining surface is covered by an interlayer dielectric (ILD) (32).

Figure 3:
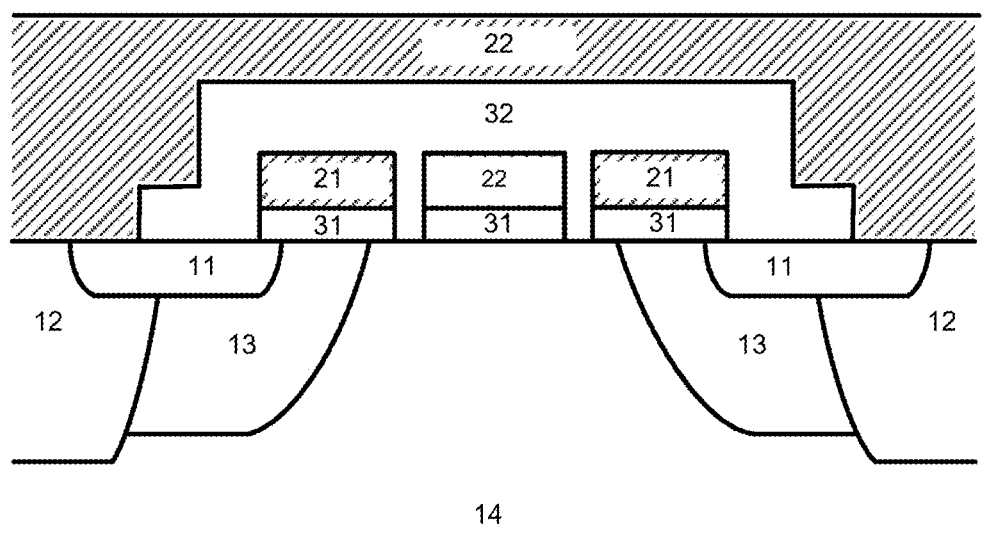
FIG. 3 is a cross sectional view of a further power MOSFET structure in the prior art.

FIG. 3 is a cross sectional view of a further power MOSFET structure in the prior art. The device has split gates (21) and a dummy gate (22) between the split gates (21). The dummy gate (22) is connected to a source electrode (22) and is isolated from the split gates (21) through an ILD (32).

Figure 4:
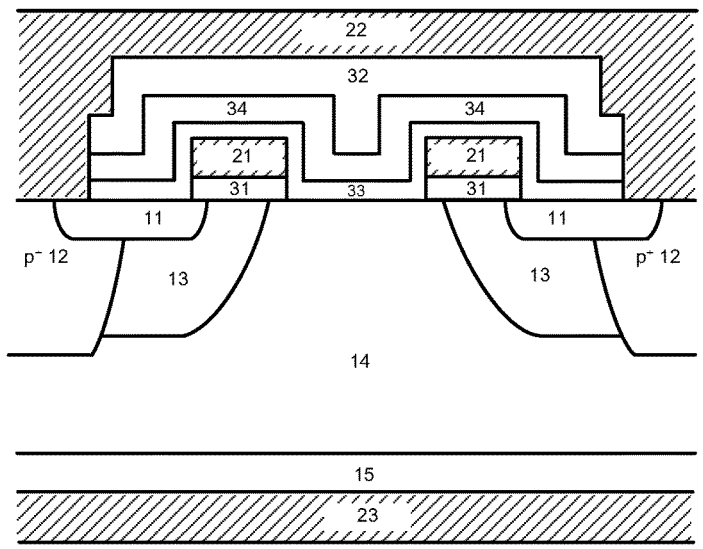
FIG. 4 is a cross sectional view applied in a power MOSFET of the present invention.

FIG. 4 is a cross sectional view of the present invention implemented in a power MOSFET. The planar power MOSFET structure comprises a drain electrode (23) at the bottom; an n$^+$ substrate (15); an n$^-$-epitaxy (14) on the top of the n$^+$ substrate (15); a p$^+$ diffusion (12) which is contacted by a source electrode (22); a p-type body region (13) which is connected to the source electrode (22) through the p$^+$ diffusion (12); an n$^+$ source (11) which is contacted by the source electrode (22); a gate dielectric (31) which covers the surface of the p-type body region (13) and forms a channel between the n$^+$ source (11) and the n$^-$-epitaxy (14); a split gate electrode (21) on the top of the gate dielectric (31); a thin dielectric layer (33) which covers the surfaces of the split gate (21) and the n$^-$-epitaxy (14); a semi-insulating field plate (34) which is on the top of the thin dielectric layer (33) and is contacted by the source electrode (22) at the side wall; an interlayer dielectric (ILD) (32) on the top of the semi-insulating field plate (34); and the source electrode (22) which is in contact holes (41) and on the top of the ILD (32). The source electrode (22) and the drain electrode (23) are generally metal or metal silicide. The gate dielectric (31) is generally silicon oxide, but other high dielectric constant materials (e.g. aluminum oxide, oxynitride and hafnium oxide) can also be used as the gate dielectric (31). The gate electrode (21) of the device is generally polysilicon, because it is suitable for the self-aligned high-temperature process. However, metal or metal silicide can also be used for the gate electrode (21) for the object of minimizing the gate resistance. The thin dielectric layer (33) is generally silicon oxide, but other dielectric materials can also be used for the object of isolation. The ILD (32) is also used for isolation, and the ILD (32) is generally silicon oxide. The semi-insulating field plate (34) can be made of any high resistivity material, including, but not limited to titanium nitride, polysilicon and amorphous silicon.

Figure 5:
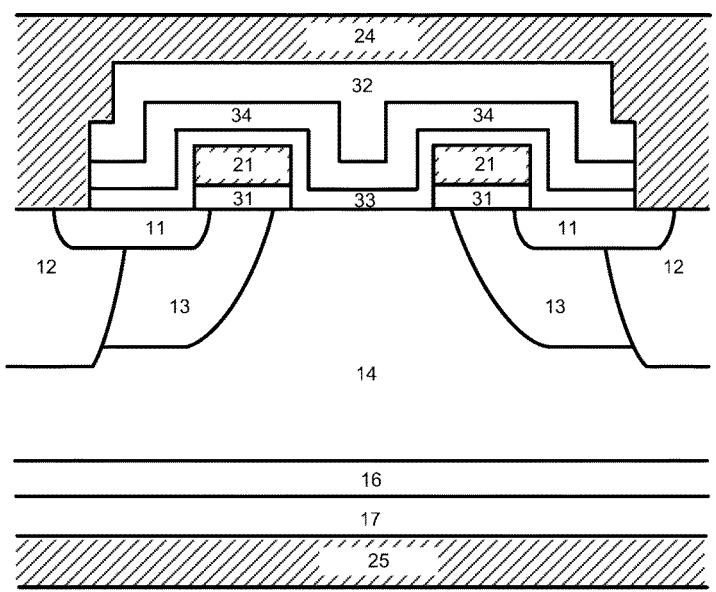
FIG. 5 is a cross sectional view applied in an IGBT of the present invention.
Figure 6D:
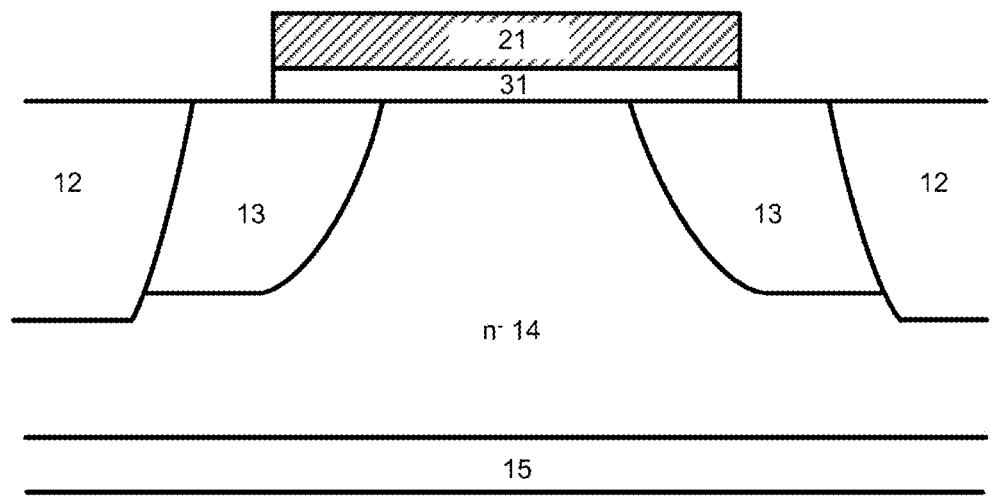
Figure 6E:
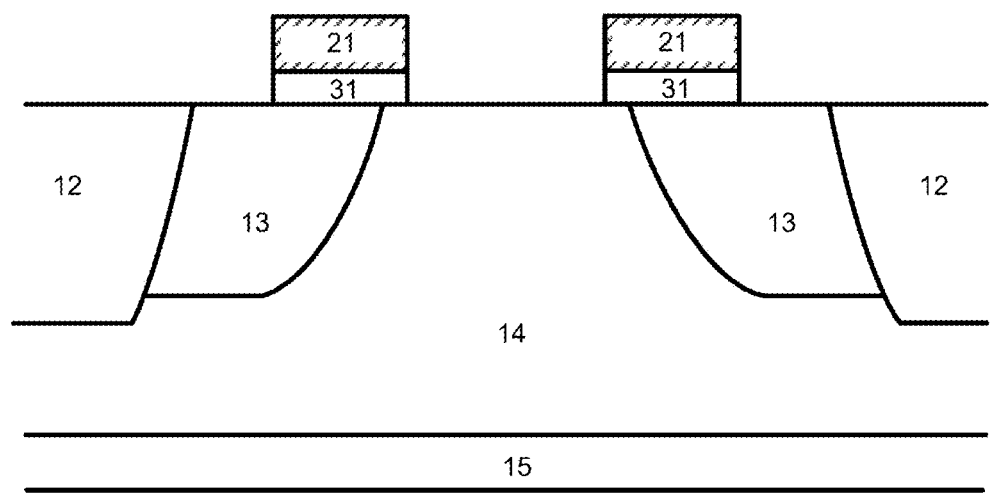
Figure 6F:
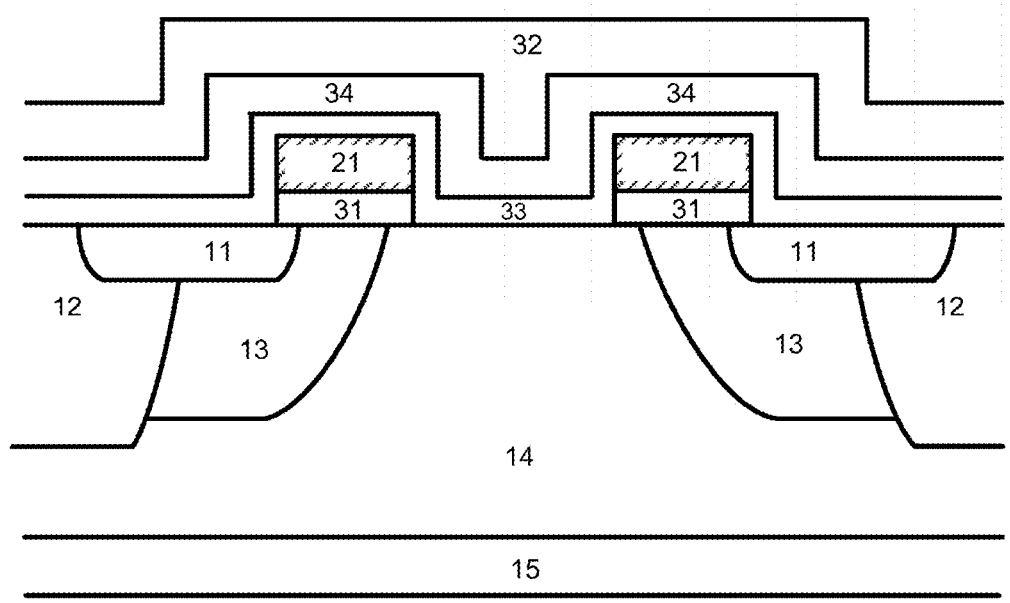
Figure 6G:
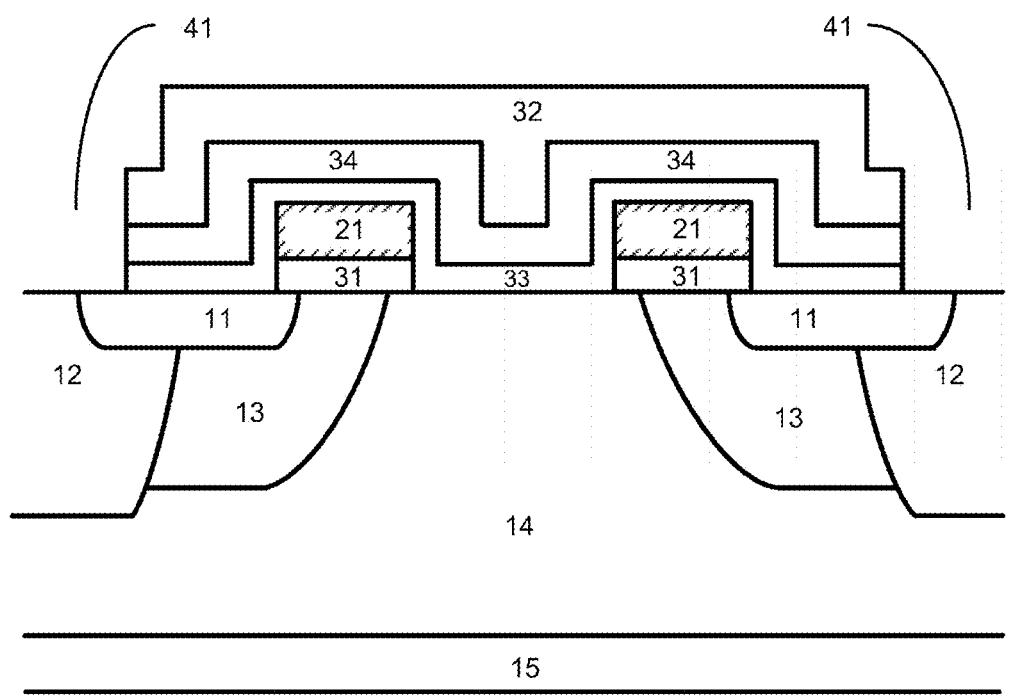
Figures 6H, 7A:
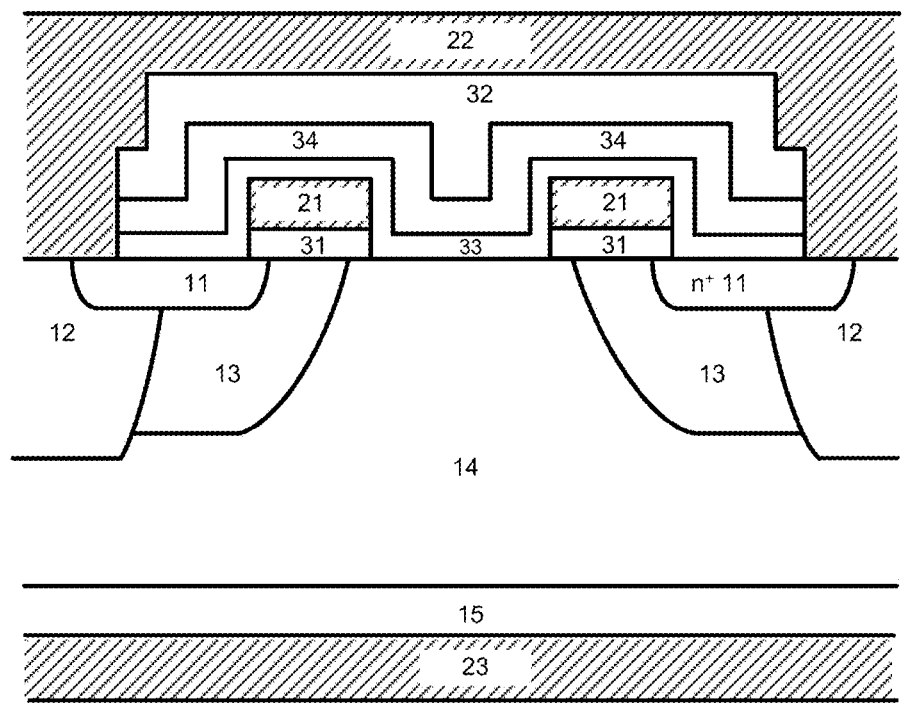

FIG. 5 is a cross sectional view of the present invention implemented in an IGBT. The structure of the IGBT is similar to that of the power MOSFET structure as previously shown in FIG. 4. In the IGBT, an emitter electrode (24) instead of the source electrode (22) is positioned on the surface, and a collector electrode (25) instead of the drain electrode (23) is positioned at the bottom. The n$^+$ substrate (15) is not present in the IGBT, but an n buffering region (16) and a p$^+$ collecting region (17) are positioned below an n$^-$ drift region (14).

FIG. 6A-FIG. 6H show the critical process steps of manufacturing the power MOSFET as previously shown in FIG. 4. The manufacturing process comprises (1) forming the n$^-$-epitaxy (14) on the top of the n$^+$ substrate (15) via epitaxial growth; (2) forming the p$^+$ diffusion (12) by implantation and main diffusion; (3) forming the gate dielectric (31), forming the gate electrode (21) by deposition, and patterning both the gate dielectric (31) and the gate electrode (21); (4) forming the p-type body region (13) by self-aligned implantation and main diffusion; (5) forming the split gate (21) by patterning the gate electrode (21) and the gate dielectric (31); (6) forming the n$^+$ source electrode (11) by implantation and annealing, and depositing the thin dielectric layer (33), the semi-insulating field plate (34) and the ILD (32); (7) patterning the ILD (32), the semi-insulating field plate (34) and the thin dielectric layer (33) to form contact holes (41); and (8) forming the source electrode (22) on the surface and forming the drain electrode (23) at bottom. In the manufacturing process, the split gate (21) is formed by photolithography and then etching. Such photolithography generally needs an extra mask. In addition, after the split gate (21) is formed, the ion implantation step can optionally be added before the n$^+$ source electrode (11) is formed, to increase the doping concentration of the upper part of the n$^-$-epitaxy (14), and therefore produce a reduced on-resistance. The ILD (32), the semi-insulating field plate (34) and the thin dielectric layer (33) can be subjected to mask lithography applied for the contact holes (41), then etched and patterned together.

Figure 7B:
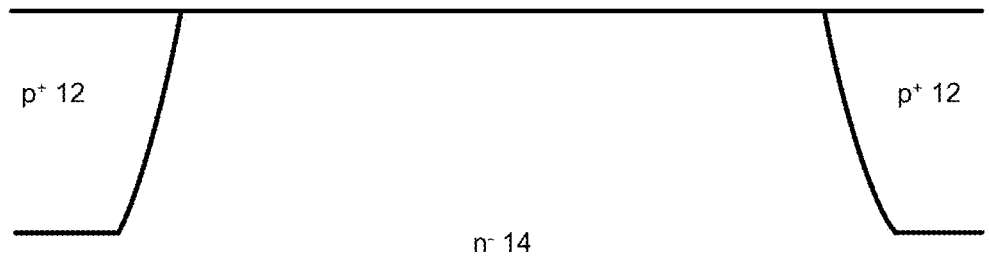
Figure 7C:
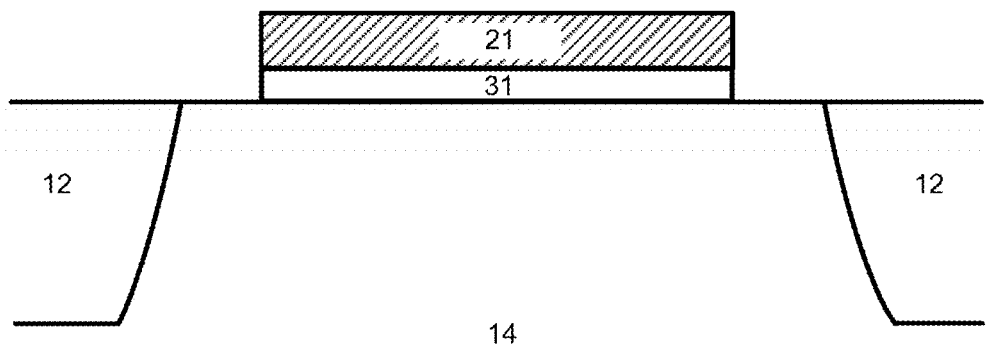
Figure 7D:
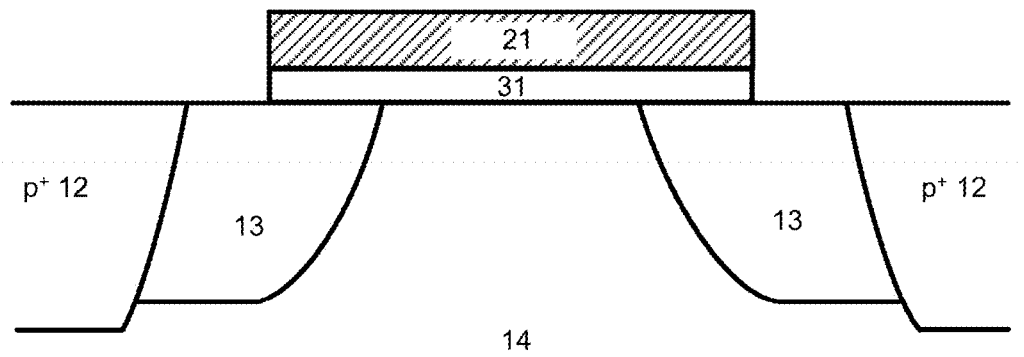
Figure 7E:
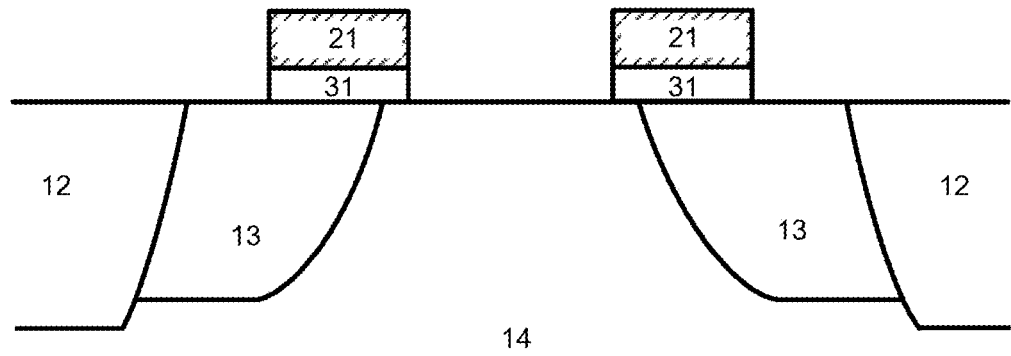
Figure 7F:
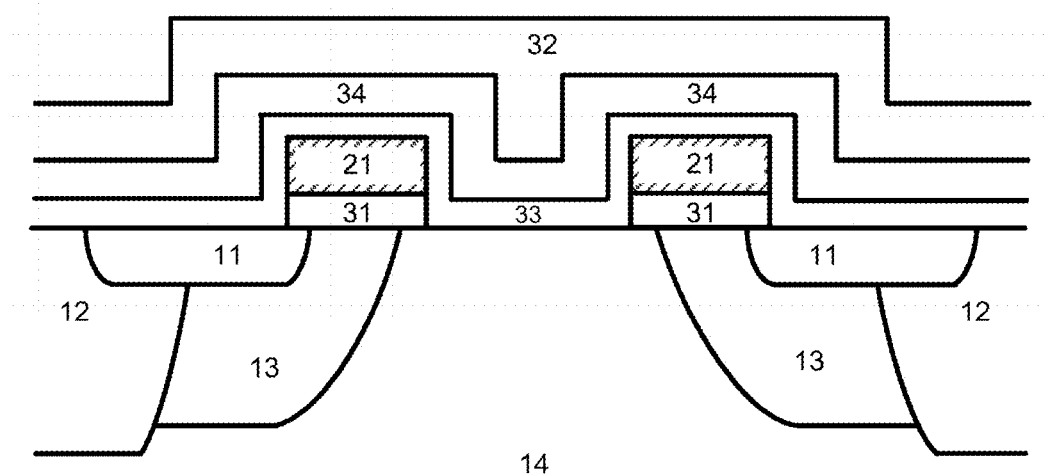
Figure 7G:
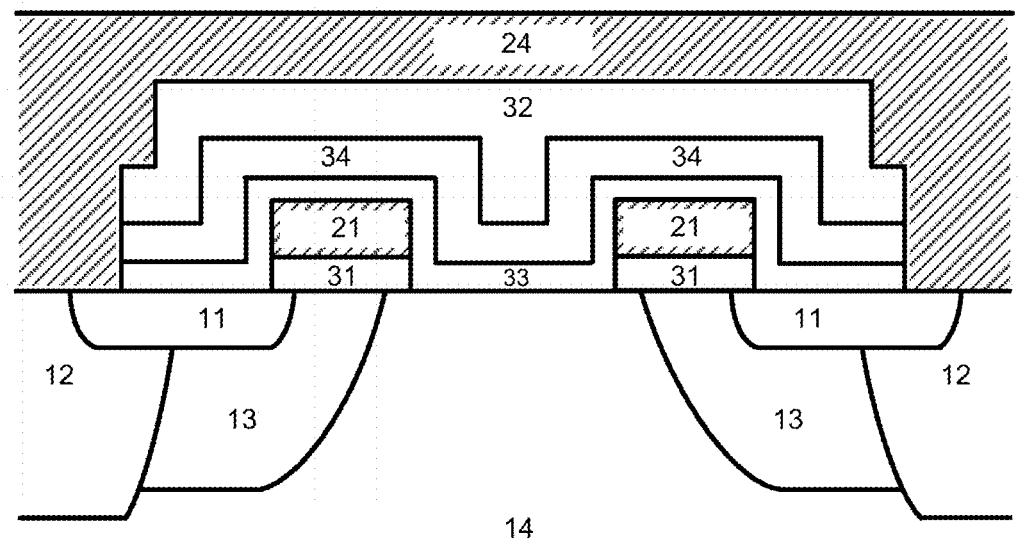
Figure 7H:
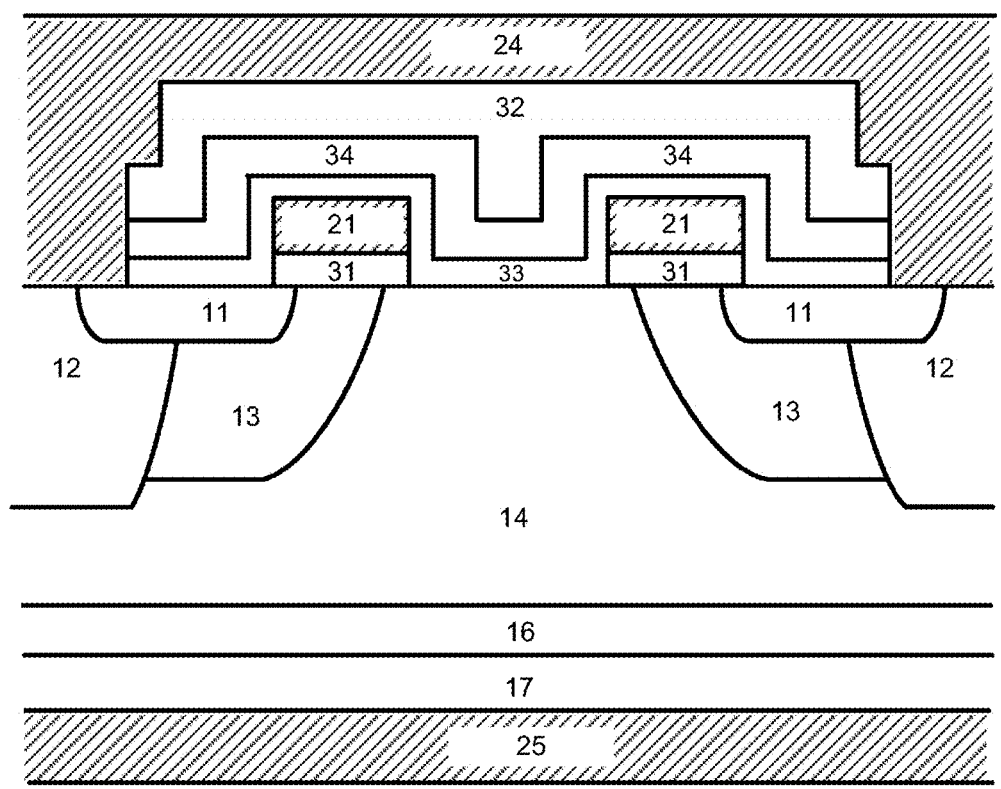

FIG. 7A to FIG. 7H show the critical manufacturing process steps of the IGBT previously shown in FIG. 5. The manufacturing steps are similar to those shown in FIG. 6A to FIG. 6H. During the manufacturing of the IGBT, the process starts with the lightly doped n$^-$ substrate wafer (14) instead of n$^-$-epitaxy (14). The process is the same as the process of the power MOSFET, until an emitter electrode (24) is formed on the surface, as shown in FIG. 7G. After this step, the n$^-$ substrate wafer (14) is thinned down, and an n buffer region (16) is formed by ion implantation and annealing at the rear side. A p$^+$ collector region (17) is subsequently formed by ion implantation and annealing at the rear side. Finally, a collector (25) is formed at the rear side of the wafer, as shown in FIG. 7H.

What is claimed is:

1. A split gate planar power metal oxide semiconductor field effect transistor (MOSFET) structure, comprising
   a drain electrode at the bottom;
   a heavily doped substrate of a first conductivity type;
   a lightly doped epitaxial layer of the first conductivity type, the lightly doped epitaxial layer being on the top of the heavily doped substrate;
   a heavily doped diffusion of a second conductivity type, the heavily doped diffusion being contacted by a source electrode;
   a body region of the second conductivity type, the body region being connected to the source electrode through the heavily doped diffusion;
   a heavily doped source of the first conductivity type, the heavily doped source being contacted by the source electrode;
   a gate dielectric covering the surface of the body region and forming a channel between the heavily doped source and the lightly doped epitaxial layer;
   a split gate electrode, the split gate electrode being on the top of the gate dielectric;

a thin dielectric layer, covering the surfaces of the split gate electrode and the lightly doped epitaxial layer;

a semi-insulating field plate, the semi-insulating field plate being on the top of the thin dielectric layer and contacted by the source electrode at the side wall;

an interlayer dielectric (ILD), the interlayer dielectric being on the top of the semi-insulating field plate; and the source electrode, the source electrode being in contact holes and on the top of the ILD.

2. The split gate planar power MOSFET structure according to claim 1, wherein the gate dielectric is silicon oxide.

3. The split gate planar power MOSFET structure according to claim 1, wherein the split gate electrode is at least one of polysilicon, metal and metal silicide.

4. The split gate planar power MOSFET structure according to claim 1, wherein the thin dielectric layer is silicon oxide.

5. The split gate planar power MOSFET structure according to claim 1, wherein the semi-insulating field plate comprises titanium nitride, polysilicon and amorphous silicon.

6. The split gate planar power MOSFET structure according to claim 1, wherein the ILD is silicon oxide.

7. The split gate planar power MOSFET structure according to claim 1, wherein both the drain electrode and the source electrode are metal or metal silicide.

* * * * *